(12) United States Patent
Andideh et al.

(10) Patent No.: US 6,448,185 B1
(45) Date of Patent: Sep. 10, 2002

(54) METHOD FOR MAKING A SEMICONDUCTOR DEVICE THAT HAS A DUAL DAMASCENE INTERCONNECT

(75) Inventors: Ebrahim Andideh; Alan M. Myers, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/872,109

(22) Filed: Jun. 1, 2001

(51) Int. Cl.$^7$ .............................................. H01L 21/302
(52) U.S. Cl. ........................ 438/706; 438/687; 438/688
(58) Field of Search ................................. 438/624, 637, 438/631, 633, 638, 643, 687, 688, 706

(56) References Cited

U.S. PATENT DOCUMENTS

| | | | |
|---|---|---|---|
| 4,587,138 A | 5/1986 | Yau et al. | |
| 4,910,122 A | 3/1990 | Arnold et al. | |
| 5,892,096 A | 4/1999 | Meador et al. | |
| 6,251,770 B1 * | 6/1999 | Uglow et al. | 438/624 |
| 6,184,138 B1 * | 9/1999 | Ho et al. | 438/687 |
| 6,033,977 A | 3/2000 | Gutsche et al. | |
| 6,037,255 A | 3/2000 | Hussein et al. | |
| 6,057,239 A | 5/2000 | Wang et al. | |

OTHER PUBLICATIONS

Roderick R. Kunz et al., "Materials Evaluation of Antireflective Coatings for Single Layer 193–nm Lithography" Advances in Resist Technology and Processing XI, Proceedings SPIE–The International Society for Optical Engineering, Feb. 1994, vol. 2195, pp. 447–460, San Jose, CA.

* cited by examiner

*Primary Examiner*—Hoai Ho
*Assistant Examiner*—Reneé R. Berry
(74) *Attorney, Agent, or Firm*—Mark V. Seeley

(57) ABSTRACT

An improved method of forming a semiconductor device is described. In that method, a dielectric layer that comprises a carbon doped oxide is formed on a substrate. After a first etched region is formed in the dielectric layer, that region is filled with a sacrificial light absorbing material. A layer of photoresist is then deposited and patterned, followed by forming a second etched region by removing part of the sacrificial light absorbing material and a second part of the dielectric layer. Remaining portions of the photoresist are then removed by exposing the resulting device to a plasma generated from a forming gas. The device is then exposed to a solution for removing the remaining portions of the sacrificial light absorbing material.

15 Claims, 5 Drawing Sheets

METHOD FOR MAKING A SEMICONDUCTOR DEVICE THAT HAS A DUAL DAMASCENE INTERCONNECT

FIELD OF THE INVENTION

The present invention relates to a method for making semiconductor devices.

BACKGROUND OF THE INVENTION

Dual damascene metal interconnects may enable reliable low cost production of integrated circuits using sub 0.18 micron process technology. To enable such interconnects to realize their full potential, the following method for making a semiconductor device has been proposed. In that method, a first etched region (e.g., a via or trench) is filled with a sacrificial light absorbing material ("SLAM"), after that region has been formed within a dielectric layer. That SLAM may comprise a dyed spin-on-glass ("SOG") that has dry etch properties similar to those of the dielectric layer and light absorbing properties that enable the substrate to absorb light during lithography. After the first etched region is filled with the SLAM, a second etched region (e.g., a trench if the via is already formed or a via if the trench is already formed) is formed within the dielectric layer. Most of the SLAM may be removed as that second etched region is formed. Remaining portions of the SLAM are removed by a subsequent wet etch step.

The SLAM process reduces, or eliminates, substrate reflection and the need for high etch selectivity, ensuring that such effects will not adversely affect dual damascene via and trench formation. In addition to those issues, which the SLAM process addresses, decreasing device feature size reduces the distance between metal layers, which causes capacitance to increase. To address this problem, insulating materials that have a relatively low dielectric constant are being used in place of silicon dioxide to form the dielectric layer that separates the metal lines. Forming, for example, a low k dielectric layer from carbon doped oxide ("CDO") instead of silicon dioxide to separate metal lines may yield a device having reduced propagation delay, cross-talk noise and power dissipation.

Although it is desirable to use CDO to form the dielectric layer for the above described SLAM process, current methods for removing photoresist and the SLAM from the device, after the trench is etched, can be relatively time consuming and expensive. To satisfactorily remove this material, it may be necessary to pass a device through a sequence of process steps, which include applying an oxygen plasma ash followed by a wet etch, more than once. Of even greater concern is that this current process for removing the photoresist and the SLAM may modify the etch profile in an undesirable manner. Another issue relates to how the conventional photoresist removal process may affect a CDO layer's dielectric properties. The carbon contained in such a layer may react with the oxygen based plasma used to remove the photoresist. That reaction depletes the amount of carbon contained in the layer, which raises the layer's dielectric constant.

Accordingly, there is a need for an improved process for making a semiconductor device that includes a dual damascene interconnect, which employs a sacrificial light absorbing material and a CDO containing dielectric layer to make such a device. There is a need for such a process that enables removal of photoresist and the SLAM from the device, after via and trench formation, without damaging the etch profile. There is also a need for such a process that requires less time and expense to apply. The method of the present invention provides such a process.

DETAILED DESCRIPTION OF THE PRESENT INVENTION

A method of forming a semiconductor device is described. That method comprises the following steps. First, a conductive layer is formed on a substrate. A dielectric layer that comprises a carbon doped oxide is then formed on the conductive layer, followed by forming a first etched region by removing a first portion of the dielectric layer. That first etched region is filled with a sacrificial light absorbing material that has dry etch properties similar to those of the dielectric layer. A layer of photoresist is then deposited and patterned to define a second region to be etched. A second etched region is formed by removing part of the sacrificial light absorbing material and a second portion of the dielectric layer. The resulting device is then exposed to a plasma generated from a forming gas, to remove the remaining portions of the photoresist, followed by exposing it to a solution, e.g., an HF based solution, for removing the remaining portions of the sacrificial light absorbing material.

FIGS. 1a–1i illustrate one embodiment of the method of the present invention. In that embodiment, first conductive layer 101 is formed on substrate 100. Substrate 100 may be any surface, generated when making an integrated circuit, upon which a conductive layer may be formed. Substrate 100 thus may include, for example, active and passive devices that are formed on a silicon wafer such as transistors, capacitors, resistors, diffused junctions, gate electrodes, local interconnects, etc. . . . Substrate 100 also may include insulating materials that separate such active and passive devices from the conductive layer or layers that are formed on top of them, and may include previously formed conductive layers.

Conductive layer 101 may be made from materials conventionally used to form conductive layers for semiconductor devices. In a preferred embodiment, conductive layer 101 includes copper, and is formed using a conventional copper electroplating process. Although copper is preferred, other conducting materials, which may be used to make a semiconductor device, may be used instead. Conductive layer 101 may be planarized, after it is deposited, using a chemical mechanical polishing ("CMP") step.

After forming conductive layer 101 on substrate 100, barrier layer 102 is formed on conductive layer 101. Barrier layer 102 will serve to prevent an unacceptable amount of copper, or other metal, from diffusing into dielectric layer 103. Barrier layer 102 also acts as an etch stop to prevent subsequent via and trench etch steps from exposing conductive layer 101 to subsequent cleaning steps. Barrier layer 102 preferably is made from silicon nitride, but may be made from other materials that can serve such functions, e.g., silicon carbide or cobalt, as is well known to those skilled in the art.

Figure 1A:
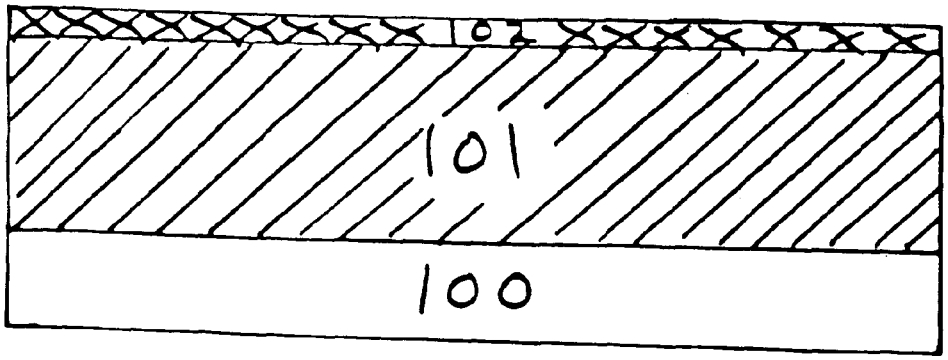
FIGS. 1a–1i illustrate cross-sections that reflect structures that may result after certain steps are used to make a semiconductor device that has a dual damascene interconnect, following one embodiment of the method of the present invention.

A chemical vapor deposition process may be used to form barrier layer 102. Barrier layer 102 should be thick enough to perform its diffusion inhibition and etch stop functions, but not so thick that it adversely impacts the overall dielectric characteristics resulting from the combination of barrier layer 102 and dielectric layer 103. FIG. 1a illustrates a cross-section of the structure that results after conductive layer 101 and barrier layer 102 have been formed on substrate 100.

Dielectric layer 103 is then formed on top of barrier layer 102. In the method of the present invention, dielectric layer 103 comprises a carbon doped oxide ("CDO"). Those of ordinary skill in the art will appreciate that such a material may be deposited on the surface of barrier layer 102 using a conventional plasma enhanced chemical vapor deposition ("PECVD") process. Dielectric layer 103 preferably consists essentially of a CDO that includes between about 5 and about 50 atom % carbon, and preferably has a thickness of between about 300 and about 3,000 nanometers.

Figure 1B:
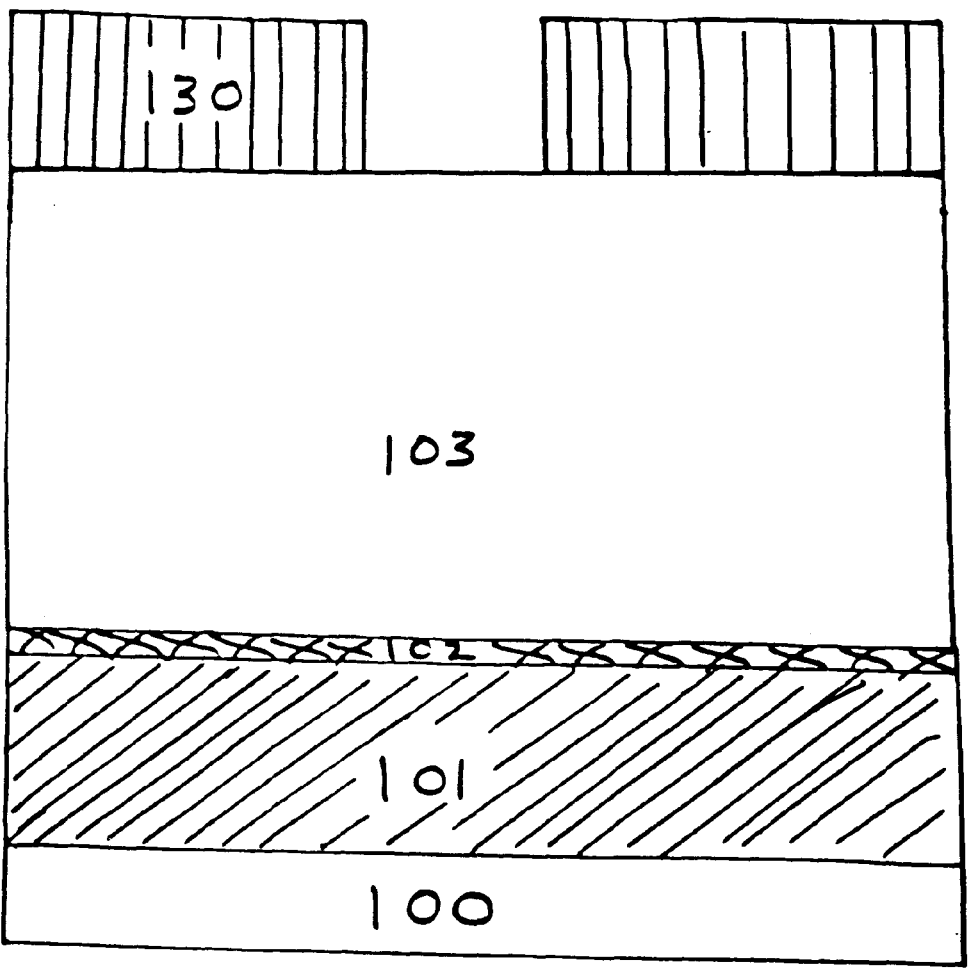
Figure 1C:
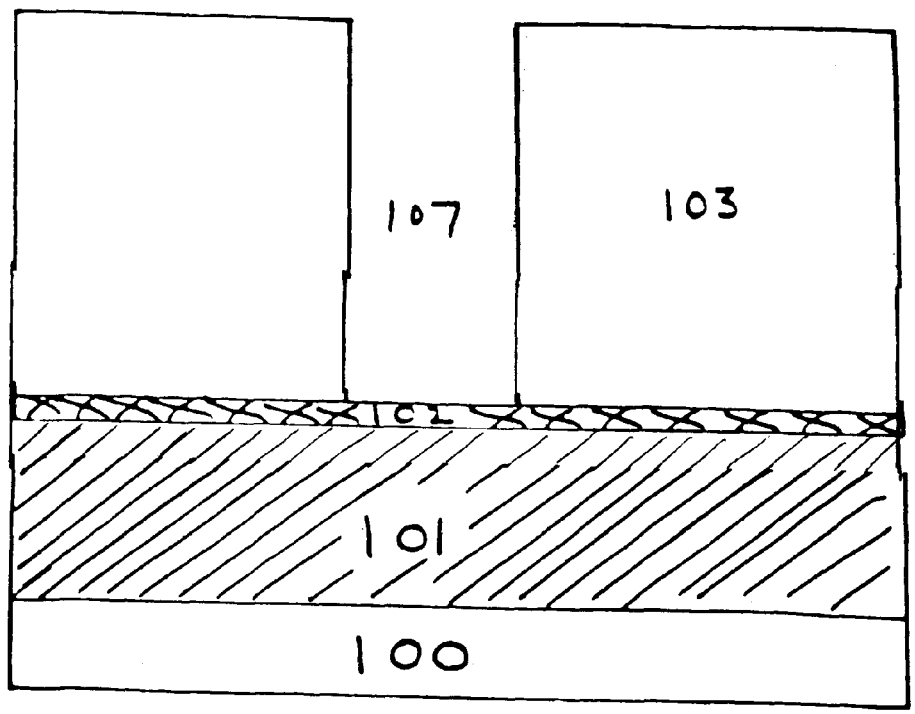

After forming dielectric layer 103, a photoresist layer 130 is patterned on top of it to define a via formation region for receiving a subsequently formed conductive layer that will contact conductive layer 101. Photoresist layer 130 may be patterned using conventional photolithographic techniques, such as masking the layer of photoresist, exposing the masked layer to light, then developing the unexposed portions. The resulting structure is shown in FIG. 1b.

After photoresist layer 130 is patterned, via 107 is etched through dielectric layer 103 down to barrier layer 102, barrier layer 102 acting as an etch stop. Conventional process steps for etching through a dielectric layer may be used to etch the via, e.g., a conventional anisotropic dry oxide etch process. An isotropic or anisotropic forming gas ash may then be applied at an appropriate temperature and pressure to remove the photoresist. A via clean step may follow to produce the structure shown in FIG. 1c. Via 107 may be cleaned by using a conventional hydrogen fluoride ("HF") in ethylene glycol, or HF in deionized water, based wet etch process, as is well understood by those skilled in the art.

Figure 1D:
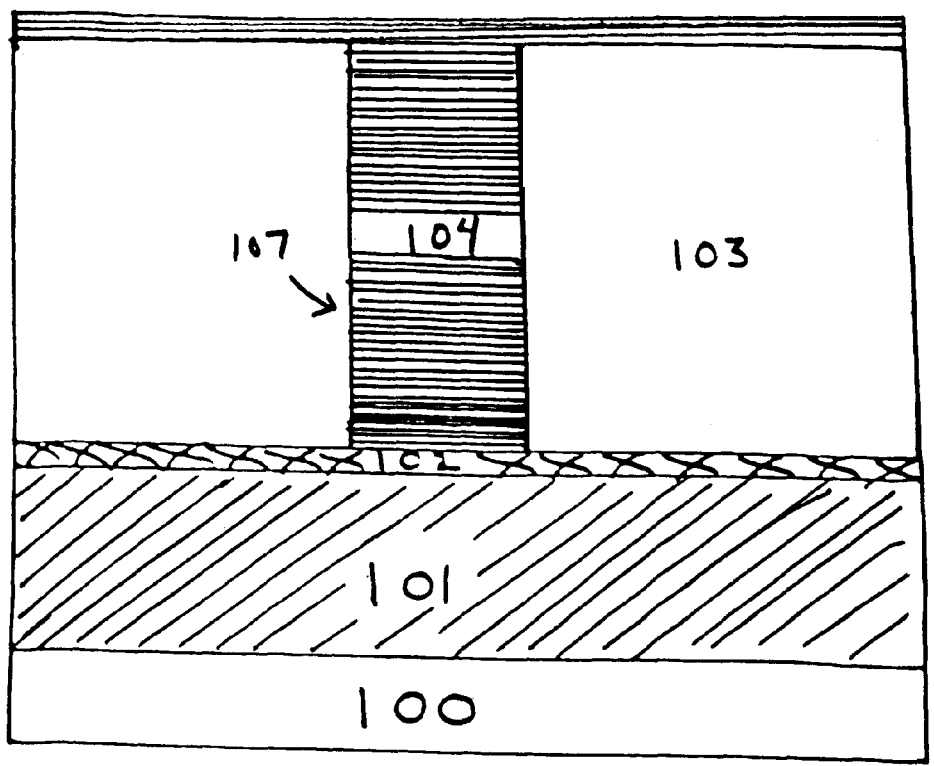

After via 107 is formed through dielectric layer 103, via 107 is filled with sacrificial light absorbing material ("SLAM") 104, generating the structure shown in FIG. 1d. SLAM 104 has dry etch properties similar to those of dielectric layer 103, but may be wet etched at a rate that is significantly faster than the rate at which dielectric layer 103 may be wet etched. Such dry etch properties should enable removal of most of SLAM 104 at the same time the dielectric layer is etched to form the trench. The high selectivity of SLAM 104 to the wet etch enables removal of that material from the surface of the device, as well as from inside via 107, without causing a significant amount of dielectric layer 103 to be removed at the same time.

Preferably, SLAM 104 comprises a dyed spin-on-glass ("SOG") that is deposited by spin coating between about 500 and about 3,000 angstroms of the material onto the surface of the device. Although only a thin layer will remain on the surface of the device, such a spin coating process should cause SLAM 104 to completely fill via 107. In addition, SLAM 104 should uniformly fill via 107. Such a uniform fill characteristic minimizes void formation, which could jeopardize the integrity of the filling and/or may expose the underlying silicon nitride layer—for an undesirable extended period of time—to the etch chemistry used to form the trench. Using a dyed SOG for SLAM 104 should reduce, or even eliminate, substrate reflectivity at DUV wavelengths (e.g., at 157, 193 or 248 nm).

The dyed SOG should provide the following properties. It may be dry etched at substantially the same rate that dielectric layer 103 is dry etched. It may be wet etched at a significantly faster rate than dielectric layer 103 is wet etched. It may absorb light such that substrate 100 is rendered substantially non-reflective when exposed to light (e.g., at 157, 193 or 248 nm) used to pattern a photoresist layer to define the trench, and it may completely and uniformly fill via 107. Both Honeywell, Inc., and Tokyo Ohka Kogyo Co. Ltd., have made a dyed SOG material that has such properties by changing the base solvent used to make one of their commercial SOG products, then selecting an appropriate dye.

Figure 1E:
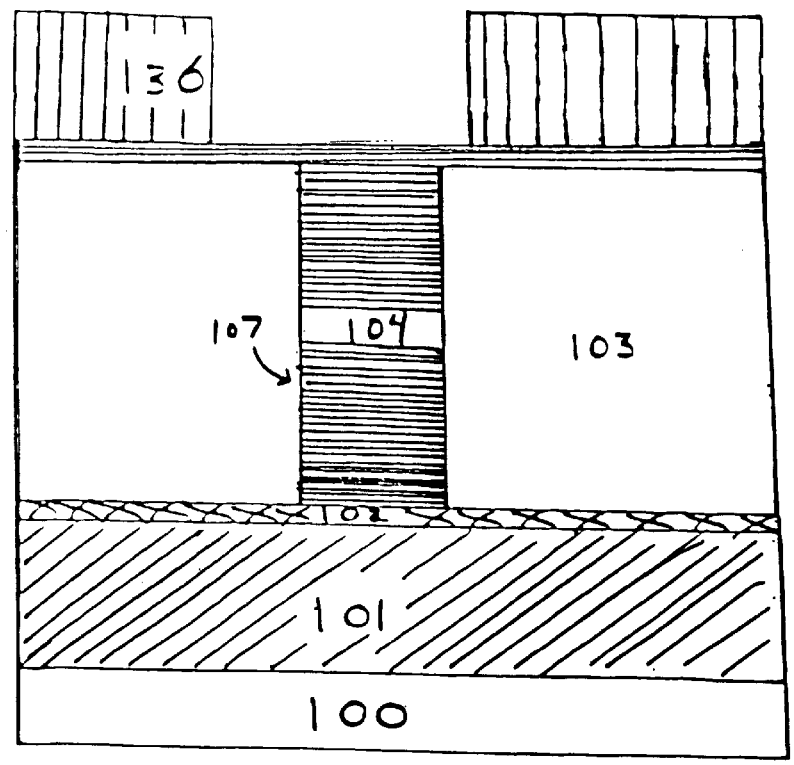
Figure 1F:
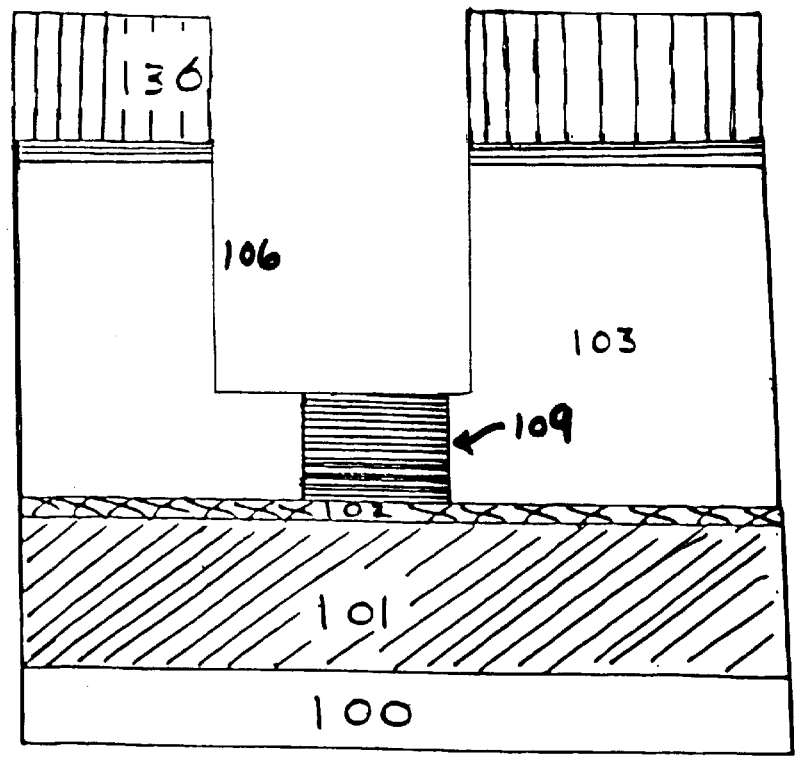
Figure 1G:
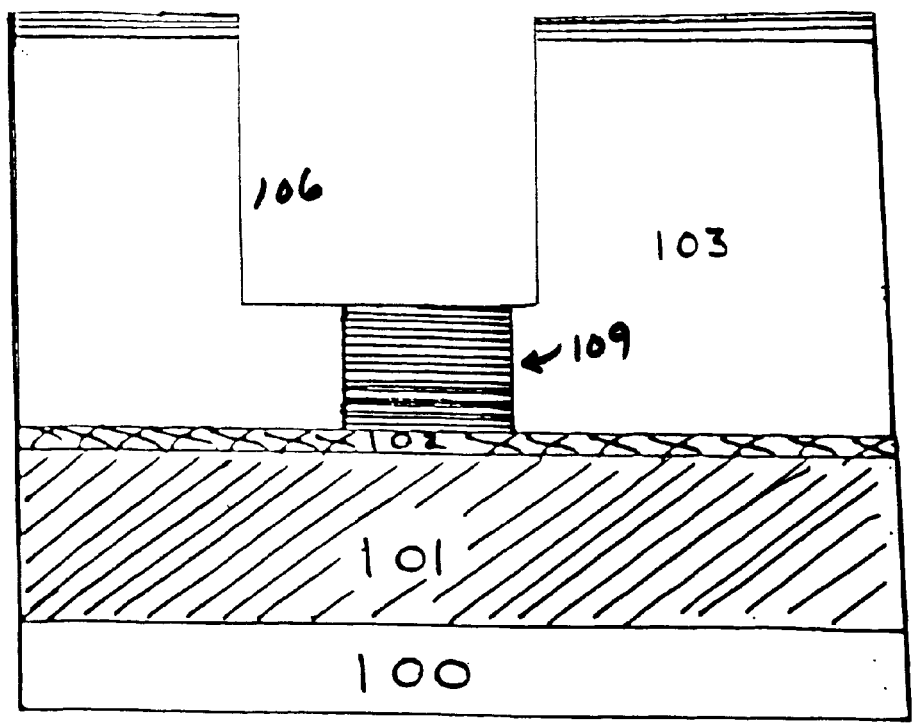

After filling via 107 with SLAM 104, photoresist layer 136 is applied on top of SLAM 104, then patterned to define a trench formation region. Photoresist layer 136 may be patterned using conventional photolithographic techniques. The resulting structure is shown in FIG. 1e. Following that photoresist patterning step, trench 106 is etched into dielectric layer 103 to form the structure shown in FIG. 1f.

The etching process is applied for a time sufficient to form a trench having the desired depth. The etch chemistry chosen to etch trench 106 preferably should remove SLAM 104 at about the same rate that it removes dielectric layer 103, or perhaps at a slightly faster rate. Trench 106 may be etched using the same equipment and etch chemistry that had been used previously to etch via 107. The presence of portion 109 of SLAM 104, which remains at the bottom of via 107 after the trench etch step, helps barrier layer 102 to protect conductive layer 101 during the trench etch process.

By filling via 107 with a sacrificial light absorbing material having dry etch characteristics like those of CDO containing dielectric layer 103, the trench lithography process effectively applies to a substantially "hole-free" surface, similar to one without vias. By selecting an appropriate dyed SOG material for SLAM 104, and an appropriate etch chemistry, trench 106 may be etched into dielectric layer 103 at approximately the same rate that SLAM 104 is removed. Because such a process protects the underlying barrier layer 102 as trench 106 is etched, it permits use of a trench etch chemistry that produces superior trench and via profiles without having to consider its effect on the selectivity between dielectric layer 103 and barrier layer 102. For example, when barrier layer 102 comprises silicon nitride or silicon carbide, this process enables use of an etch chemistry to etch the trench that does not provide a high selectivity to CDO over silicon nitride or silicon carbide.

After trench 106 is etched, the remaining portion of photoresist 136 and the remaining portion 109 of the SLAM must be removed. If a low temperature, low pressure oxygen based ashing step is used to remove photoresist 136, followed by applying a wet etch process to remove remaining residues, the ashing and clean process may have to be repeated to adequately remove the photoresist and the SLAM. In addition to requiring a significant amount of time to complete, such a process is relatively expensive and can modify the etch profile in an unacceptable fashion. Moreover, the oxygen may react with the carbon, which is contained in dielectric layer 103, to produce carbon dioxide that is released from the device. Because that reaction depletes the carbon that is included in the dielectric layer, it may cause that layer's dielectric constant to increase significantly, and render it susceptible to cracking and delamination.

For these reasons, the method of the present invention instead employs a forming gas to remove photoresist layer 136. The forming gas preferably comprises a plasma that contains hydrogen. Such a hydrogen containing plasma may comprise hydrogen combined with any of the following gases: nitrogen, helium, argon, xenon, neon, or krypton. Preferably, such a forming gas includes at least about 2% hydrogen. In a particularly preferred embodiment, such a forming gas includes about 4% hydrogen in nitrogen. The equipment and operating conditions for using a forming gas to remove photoresist layer 136 may be those typically used in this type of plasma ashing process. Such a process may remove the photoresist in either an isotropic or anisotropic fashion, and may be applied over a wide range of temperatures and pressures. Removal of photoresist layer 136 generates the structure shown in FIG. 1g.

Following such a photoresist removal step, remaining portions 109 of the SLAM must be removed. This may be accomplished by exposing the device to a solution that may wet etch that material at a significantly higher rate than it may wet etch dielectric layer 103. In a preferred embodiment, a conventional HF dip is applied to the device, wherein the solution for removing remaining portions 109 of the SLAM comprises a dilute HF solution. Such a solution may comprise a blend of ethylene glycol (or deionized water) and HF in a ratio of between about 6:1 and about 500:1. A wet etch process that uses such a solution should remove the remaining SLAM at a substantially faster rate than it removes any of the CDO.

Figure 1H:
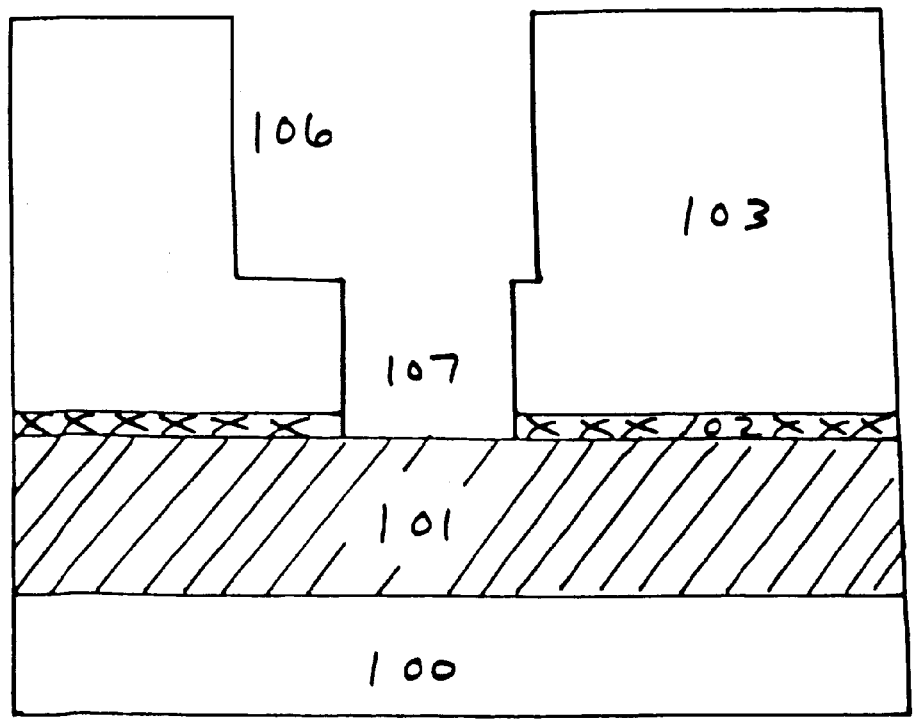

Applying a hydrogen containing plasma to remove the photoresist, followed by applying a wet etch process to remove any remaining residues and the remaining portions of the SLAM, enables those materials to be removed from the surface of a CDO containing dielectric layer. Such a process enables removal of those materials in a relatively fast and inexpensive manner, while preserving the integrity of the etch profile—without causing carbon depletion, which would increase the dielectric constant. Barrier layer 102 protects conductive layer 101 from exposure to the materials used to remove the SLAM. After the wet etch step, the portion of barrier layer 102 that separates via 107 from conductive layer 101 may be removed to expose conductive layer 101—as shown in FIG. 1h.

Following that barrier layer removal step, trench 106 and via 107 are filled with second conductive layer 105. Like conductive layer 101, conductive layer 105 preferably comprises copper, and is formed using a conventional copper electroplating process. When an excess amount of the material used to make layer 105 is formed on the surface of dielectric layer 103, one or more CMP steps may be applied to remove the excess material and to planarize the surface of layer 105. When an electroplating process is used to form conductive layer 105 from copper, that CMP step (or steps) removes both the excess copper and the underlying barrier layer.

Figure 1I:
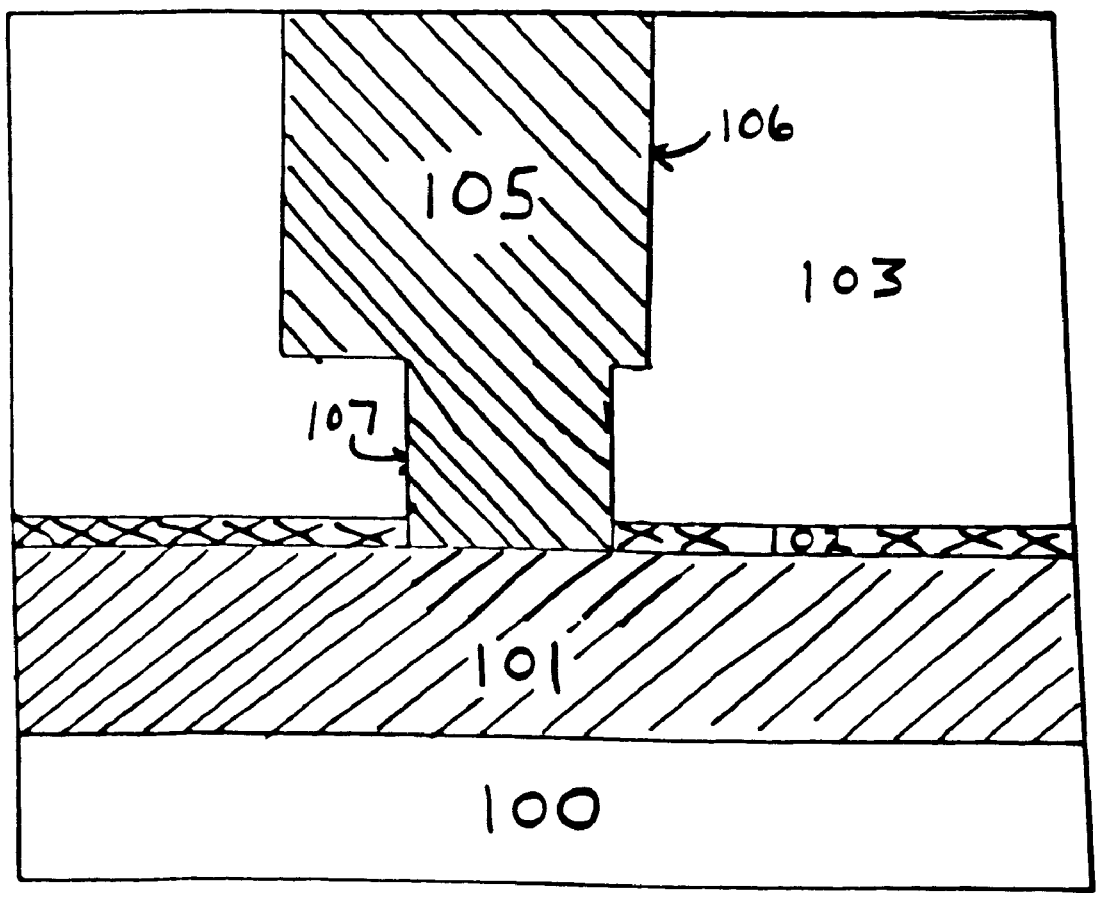

FIG. 1i shows the structure that results after filling trench 106 and via 107 with a conductive material, then applying a CMP step to remove excess material from the surface of layer 103 to produce conductive layer 105. Although the embodiment shown in FIG. 1i shows only one dielectric layer and two conductive layers, the process described above may be repeated to form additional conductive and dielectric layers until the desired integrated circuit is produced.

The improved method for making a semiconductor device of the present invention enables a device that includes a dual damascene interconnect to be made, which integrates a CDO containing dielectric layer and a sacrificial light absorbing material. The process of the present invention preserves the via and trench etch profile, while efficiently removing photoresist and SLAM in a relatively inexpensive fashion.

Although the foregoing description has specified certain steps, materials, and equipment that may be used in such a method for making a semiconductor device, those skilled in the art will appreciate that many modifications and substitutions may be made. For example, although the embodiments illustrated above apply the present invention to a method that forms the via prior to forming the trench, the process of the present invention is equally applicable to methods that form the trench prior to forming the via. Accordingly, it is intended that all modifications, alterations, substitutions and additions to the above described embodiments be considered to fall within the spirit and scope of the invention as defined by the appended claims.

What is claimed is:

1. A method of forming a semiconductor device comprising:

forming a conductive layer on a substrate;

forming a dielectric layer that comprises a carbon doped oxide on the conductive layer;

forming a first etched region by removing a first portion of the dielectric layer;

filling the first etched region with a sacrificial light absorbing material having dry etch properties similar to those of the dielectric layer;

depositing then patterning a layer of photoresist, after filling the first etched region with the sacrificial light absorbing material, to define a second region to be etched;

forming a second etched region by removing part of the sacrificial light absorbing material and a second portion of the dielectric layer; and exposing the resulting device to a plasma generated from a forming gas, to remove the remaining portions of the photoresist, following by exposing it to a solution for removing the remaining portions of the sacrificial light absorbing material.

2. The method of claim 1 wherein the forming gas comprises a mixture of hydrogen and a gas selected from the group consisting of nitrogen, helium, argon, krypton, neon, and xenon, and wherein the solution comprises hydrogen fluoride in either ethylene glycol or deionized water.

3. The method of claim 1 wherein the dielectric layer consists essentially of a carbon doped oxide.

4. The method of claim 3 wherein the carbon doped oxide includes between about 5 and about 50 atom % carbon.

5. The method of claim 1 wherein the sacrificial light absorbing material comprises a dyed SOG.

6. The method of claim 5 wherein the dyed SOG has the following properties:

it may be dry etched at substantially the same rate that the dielectric layer is dry etched;

it may be wet etched at a significantly faster rate than the dielectric layer is wet etched;

it may absorb light such that the substrate is rendered substantially non-reflective when exposed to light used to expose the photoresist; and it may completely and uniformly fill the via.

7. The method of claim 5 further comprising:

forming a barrier layer on the surface of the conductive layer prior to forming the dielectric layer;

removing part of the barrier layer after forming the second etched region; and filling the first and second etched regions with a second conductive layer.

8. The method of claim 5 wherein the semiconductor device will include a dual damascene interconnect, and wherein the first etched region forms the via for the interconnect and the second etched region forms the trench for the interconnect.

9. A method of forming a semiconductor device having a dual damascene interconnect comprising:
   forming a first conductive layer on a substrate;
   forming a barrier layer on the surface of the first conductive layer;
   forming a dielectric layer that comprises a carbon doped oxide on the surface of the barrier layer;
   patterning a first layer of photoresist, after forming the dielectric layer, to define a via;
   forming a via through a first portion of the dielectric layer;
   filling the via with a sacrificial light absorbing layer that comprises a dyed SOG;
   patterning a second layer of photoresist to define a trench;
   forming a trench within the dielectric layer by removing part of the sacrificial light absorbing layer and a second portion of the dielectric layer;
   exposing the resulting device to a plasma generated from a forming gas that comprises a mixture of hydrogen and a gas selected from the group consisting of nitrogen, helium, argon, krypton, neon, and xenon, followed by exposing it to a solution that comprises hydrogen fluoride in either ethylene glycol or deionized water; and then filling the via and trench with a second conductive layer.

10. The method of claim 9 further comprising removing a portion of the barrier layer after forming the trench and before filling the via and trench with the second conductive layer.

11. The method of claim 9 wherein the barrier layer comprises a material selected from the group consisting of silicon nitride, silicon carbide, and cobalt, and the first and second conductive layers comprise copper.

12. The method of claim 11 wherein the carbon doped oxide includes between about 5 and about 50 atom % carbon, and the solution comprises ethylene glycol and hydrogen fluoride in a ratio of between about 6:1 and about 500:1 or deionized water and hydrogen fluoride in a ratio of between about 6:1 and about 500:1.

13. A method of forming a semiconductor device having a dual damascene interconnect comprising:
   forming a first conductive layer that comprises copper on a substrate;
   forming a barrier layer that comprises silicon nitride on the surface of the first conductive layer;
   forming a dielectric layer that comprises a carbon doped oxide on the surface of the barrier layer;
   patterning a first layer of photoresist, after forming the dielectric layer, to define a via;
   forming a via through a first portion of the dielectric layer;
   filling the via with a sacrificial light absorbing layer that comprises a dyed SOG;
   patterning a second layer of photoresist to define a trench;
   forming a trench within the dielectric layer by removing part of the sacrificial light absorbing layer and a second portion of the dielectric layer;
   exposing the resulting device to a plasma generated from a forming gas that comprises a mixture of hydrogen and a gas selected from the group consisting of nitrogen, helium, argon, krypton, neon, and xenon, followed by exposing it to a solution that comprises hydrogen fluoride in either ethylene glycol or deionized water;
   removing a portion of the barrier layer; and then
   filling the via and trench with a second conductive layer that comprises copper.

14. The method of claim 13 wherein the carbon doped oxide includes between about 5 and about 50 atom % carbon, and the solution comprises ethylene glycol and hydrogen fluoride in a ratio of between about 6:1 and about 500:1 or deionized water and hydrogen fluoride in a ratio of between about 6:1 and about 500:1.

15. The method of claim 14 wherein the dyed SOG has the following properties:
   it may be dry etched at substantially the same rate that the dielectric layer is dry etched;
   it may be wet etched at a significantly faster rate than the dielectric layer is wet etched;
   it may absorb light such that the substrate is rendered substantially non-reflective when exposed to light used to expose the photoresist; and
   it may completely and uniformly fill the via.

* * * * *